United States Patent [19]

Mochizuki et al.

[11] Patent Number: 4,512,027

[45] Date of Patent: Apr. 16, 1985

[54] ELECTRONIC CALCULATING DEVICE WITH FACULTIES OF DETECTING REPRODUCTION LEVEL OF DATA APPLIED THERETO

[75] Inventors: Daisuke Mochizuki, Nara; Souichi Ohnishi, Yao; Kensaku Komai, Yamatokoriyama, all of Japan

[73] Assignee: Sharp Kabushiki Kaisha, Osaka, Japan

[21] Appl. No.: 125,093

[22] Filed: Feb. 27, 1980

[30] Foreign Application Priority Data

Feb. 28, 1979 [JP] Japan .................................. 54-23648
Mar. 28, 1979 [JP] Japan .................................. 54-37224

[51] Int. Cl.³ .................................................. G07C 3/00
[52] U.S. Cl. ...................................................... 377/16
[58] Field of Search .............. 364/404, 405, 406, 569; 235/92 T, 92 CA, 92 AC, 92 NT, 92 PB; 307/234, 350, 362; 328/111, 115; 340/661, 662, 663

[56] References Cited

U.S. PATENT DOCUMENTS

| | | | |
|---|---|---|---|
| 3,705,386 | 12/1972 | Gueldenpfennig et al. | 340/167 A |
| 3,774,156 | 11/1973 | Marsalka et al. | 364/200 |
| 3,886,463 | 5/1975 | Caprio | 307/234 |
| 3,961,271 | 6/1976 | Zlydak et al. | 307/234 |
| 3,996,586 | 12/1976 | Dillon et al. | 307/234 |
| 4,112,501 | 9/1978 | Önnestam | 364/900 |
| 4,117,542 | 9/1978 | Klausner | 364/900 |
| 4,135,161 | 1/1979 | Torrieri | 307/234 |
| 4,152,651 | 5/1979 | Lampert | 375/1 |
| 4,173,756 | 11/1979 | Kawagai | 340/663 |
| 4,207,524 | 6/1980 | Purchase et al. | 340/167 A |

*Primary Examiner*—Raulfe B. Zache
*Assistant Examiner*—David Y. Eng
*Attorney, Agent, or Firm*—Birch, Stewart, Kolasch & Birch

[57] ABSTRACT

An electronic calculating machine includes a control circuit for receiving digital calculation information recorded in an audio tape to be applied to the machine. The control circuit comprises a circuit for forming the information to pulse signals, a circuit for counting the pulse width in a time period, a circuit for comparing the pulse width with a certain value preset therein, and a display for showing the comparison results by letter information.

5 Claims, 7 Drawing Figures

ELECTRONIC CALCULATING DEVICE WITH FACULTIES OF DETECTING REPRODUCTION LEVEL OF DATA APPLIED THERETO

BACKGROUND OF THE INVENTION

The present invention relates to a calculating machine such as an electronic cash register. More particularly, the present invention relates to a data reproduction-level detecting device adapted to the calculating machine.

Recently, an audio cassette tape has been employed for storing data in the form of analog information useful for an electronic apparatus of a stored program system. In introducing data from the audio cassette tape to an entry means of the electronic cash register, the data has previously been taken out through earphone terminals connected to a sound volume adjustment circuit for a cassette tape deck. Therefore, adjustment of sound volume greatly affects the reliability of the data introduced.

The sound volume of the data from the cassette tape deck to the entry means of the electronic apparatus has been controlled by changing volume in the cassette tape deck. The control of the volume in the cassette tape deck was conducted with the help of only perception of the operator. When the data once entered into the entry means did not have an appropriate reproduction level and, accordingly, error was detected, the operator was informed of the presence of error and had to repeat the entry operation of the data from the beginning.

SUMMARY OF THE INVENTION

Accordingly, it is the primary object of the present invention to provide an improved electronic calculating machine capable of detecting the suitability of the reproduction of data, entered therein.

It is another object of the present invention to provide an improved electronic calculating machine such as an electronic cash register capable of detecting the reproduction level of data reproduced and entered therein and of displaying it.

It is a further object of the present invention to provide an improved level detecting device adapted to an electronic calculating machine such as an electronic cash register, the level detecting device serving to determine appropriate level in data reproduced and admitted therein.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, an electronic calculating machine includes a control circuit for receiving calculation information recorded on an audio tape. The control circuit comprises a circuit for forming the information into pulse signals, a circuit for counting the pulse width in a time period, a circuit for comparing the pulse width with a certain value preset therein, and a display for showing the comparison results by letter information.

BRIEF DESCRIPTION OF THE DRAWINGS

The present invention will become more fully understood from the detailed description given hereinbelow and accompanying drawings which are given by way of illustration only, and thus are not limitative of the present invention and wherein.

DESCRIPTION OF THE PRESENT INVENTION

Figure 1:
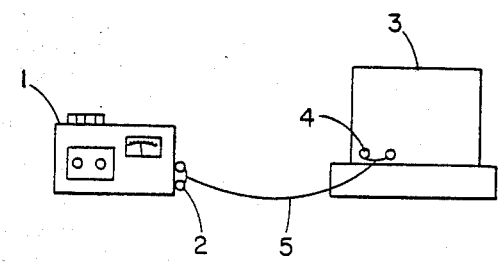
FIG. 1 shows a schematic representation of connection between an electronic apparatus of the present invention and an audio tape deck.

With reference to FIG. 1, there are shown an audio tape deck 1, earphone terminals 2, an electronic calculating machine 3 such as an electronic cash register, input terminals 4, and a cable 5. As shown in FIG. 1, the electronic calculating machine 3 is coupled to the audio tape deck 1 by the cable 5 for receiving calculation information from the deck 1. Although not be shown in FIG. 1, the electronic calculating machine 3 may comprise a keyboard for entering price information, a calculation circuit for calculating the price information according to the entered price information, and a display for indicating the price information and the calculation results, which are all well-known in the art. The audio tape deck 1 drives an audio cassette tape contained and reproduces data from it. The data is admitted from the earphone terminals 2 to the input terminals 4 of the electronic calculating machine 3 via the cable 5. The electronic calculating machine 3 includes a level detecting circuit according to the present invention.

Figure 2:
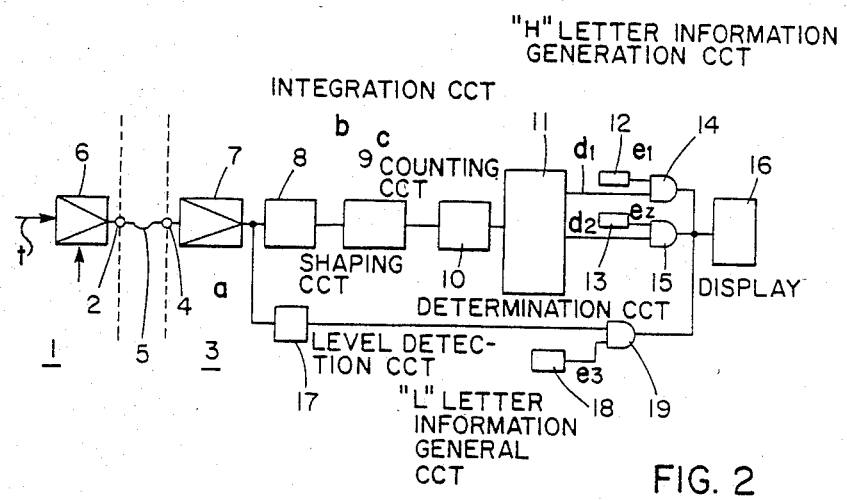
FIG. 2 shows a block diagram of a level detecting circuit incorporated within the electronic apparatus.

FIG. 2 shows a block diagram of the level detecting circuit. Like elements corresponding to those of FIG. 1 are indicated by like numerals. The level detecting circuit is connected to the input terminals 4 so that it receives the data developed from the earphone terminals 2, the data being amplified by an amplifier 6 contained within the audio tape deck 1.

The level detecting circuit comprises an amplifier 7, an integration circuit 8, a shaping circuit 9, a counting circuit 10, a determination circuit 11, an "H" letter information generation circuit 12, an "M" letter information generation circuit 13, an "L" letter information 18, a level detection circuit 17, three AND gates 14, 15 and 19, and a display 16.

The amplifier 7 functions to amplify the data entered from the input terminals 4 to an appropriate level. The integration circuit 8 also serves as a rectifier in addition to the function of integrating signals. The shaping circuit 9 acts to shape signals into square wave forms. The counting circuit 10 is provided for counting the time length of the square wave pulses. The determination circuit 11 compares the magnitude of the time length with an appropriate desired time period.

The "H" letter information generation circuit 12 provides information signals indicating "H" which means that the reproduction level of the data reproduced by the audio tape deck 1 is in excess. The "M" letter information generation circuit 13 provides information signals representing "M" which means that the reproduction level of the data reproduced by the audio tape deck 1 is appropriate. The "L" letter information generation circuit 18 provides information signals representing "L" which means that the reproduction level of the data provided by the audio tape deck 1 is too little.

The level detection circuit 17 detects that the reproduction level of the data is too little. The display 16 indicates selected one of the three kinds of letters "H", "M", and "L". The display 16 is secured as a usual display for indicating price information applied to the electronic cash register.

Prior to the description of the operation of the level detection circuit of the present invention, digital information recorded in the audio cassette tape in converted analog form or indirect digital form, if necessary, will be described.

Figure 3:
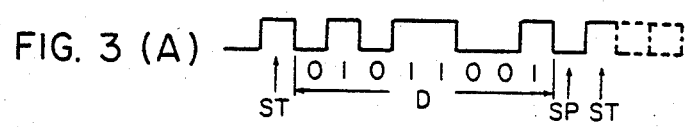
FIGS. 3(A) and 3(B), and 4(A) through 4(C) represent various signals occurring within the control circuit shown in FIG. 2.
Figure 3:
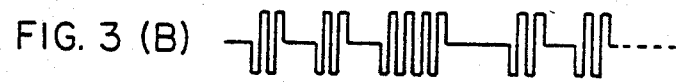

FIG. 3(A) shows wave forms of digital information which should be recorded in the audio cassette tape in converted analog form. The digital information comprises ten-bits information composed of a start bit of one bit, eight bits data, and a stop bit of one bit. The start bit functions as synchronization bit between the data. It is, for example, in a high level. The stop bit acts to indicate the termination of true data and in a low level, for example.

FIG. 3(B) indicates AC wave form modified from the digital information for recording purposes. Signals in the high level are converted to the AC wave form. The AC wave form as shown in FIG. 3(B) is applied to recording terminals of the audio tape deck 1. Respective time length in bits are regulated in an appropriate amount by a clock generator. Level control signals may be provided for indicating the standard in amplitude of the AC wave form prior to the transmittance of the true data. Time control signals may be generated for indicating the standard in time length in the bit, too.

Figure 4:
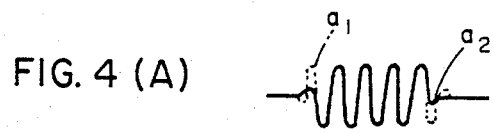
Figure 4:
Figure 4:

The operation of the level detection circuit of the present invention is as follows:

The reproduced data developed from the audio tape deck 1 are admitted to the input terminals 4 of the electronic calculating machine 3. The entered reproduced data is amplified by the amplifier 7 so that AC wave form represented in the solid line of FIG. 4(A) is obtained in connection with one bit in the high level. The AC wave form is rectified and then integrated by the following integration circuit, with the result that a wave form indicated by the solid line of FIG. 4(B) is developed. The wave form was shaped to square pulse signals indicated by the solid line of FIG. 4(C) by the following shaping circuit 9. The pulse time period of the pulse signals obtained is determined by the following counting circuit 10. The solid line of the respective signals in FIGS. 4(A) through 4(C) is related to the condition that the reproduction level of the data developed from the audio tape deck 1 is adequate. In this instance, a pulse time period T1 is counted.

On the contrary, when the reproduction level is excessive, additional parts a1 and a2 of wave form as represented by the dotted line of FIG. 4(A) are produced. The additional parts a1 and a2 are produced due to the existance within ordinary audio tape decks contain of an AC-coupling amplifier. When amplification degree by the amplifier exceeds a threshold level, the additional parts a1 and a2 of a half cycle developed.

In such a case, the integration circuit 8 develops abnormal wave form which is obtained by the addition of wave form represented by the dotted line of FIG. 4(B) to the normal wave form by the solid line of FIG. 4(B). Therefore, the shaping circuit 9 generates the corresponding abnormal wave form obtained by the addition of wave form indicated by the dotted line of FIG. 4(C) to the normal wave form indicated by the solid line of FIG. 4(B). The pulse time period in this case is determined to be T2 (>T1) by the counting circuit 10.

The determination circuit 11 compares a measured pulse time period and a predetermined pulse time period which is selectively applied thereto. When the measured pulse time period is more than the preset value, the determination circuit 11 develops output signals of a high level through an output terminal d1. The output signals developed from the output terminal d1 are entered to the AND gate 14. The "H" letter information generation circuit 12 delivers the "H" information signals e1 introduced to the AND gate 14. The predetermined pulse time period preset in the determination circuit 11 may be replaced by another different value, selectively. The AND gate 14 is responsive to the output signals developed from the output terminal d1 for conducting the "H" information signals e1.

When the measured pulse time period is equal to or less than the preset value, the determination circuit 11 generates output signals of high level through another output terminal d2. The AND gate 15 receives the output signals from the output terminal d2 and the "M" letter information signals e2 from the "M" letter information generation circuit 13. The display 16 is connected to the AND gates 14 and 15 so as to indicate the letters of "H" and "M", selectively.

The level detection circuit 17 is coupled to the amplifier 7 to detect whether the reproduction level, rather than the pulse time period, has an appropriate value. When the reproduction level is less than the appropriate value, the level detection circuit 17 develops output signals entered to the AND gate 19. At the same time, it prevents the determination circuit 11 from operating. The AND gate 19 receives the output signals from the level detection circuit 17 and the "L" letter information signals e3 from the "L" letter information generation circuit 18. The AND gate 19 conducts the "L" letter information signals applied to the display 16. The display 16 indicates the "L" letter, too.

The operator may control the volume in the audio tape deck 1 so that the display 16 indicates the letter "M" representing that the reproduction level is adequate. It should be noticed that the level detection circuit of the present invention comprises all the digital circuits such as the integration circuit and the counting circuit, with the result that it can be simplified more than in the conventional analog circuits.

The invention being thus described, it will be obvious that the same may be varied in many ways. Such variations are not to be regarded as a departure from the spirit and scope of the invention, and all such modifications are intended to be included within the scope of the following claims.

What is claimed is:

1. An electronic calculating machine including means for receiving information which is recorded on an audio tape, said information being recorded as a variable amplitude digital information signal having each pulse frequency modulated by a high frequency signal, said each pulse frequency modulated by said high frequency signal being lengthened in duration by an overvoltage condition, said means for receiving including a means for monitoring comprising:

integrator means receiving said digital information signal for integrating and rectifying said information signal to remove said high frequency signal and producing a pulse train signal;

shaping means responsive to said integrator means for defining the leading and trailing edges of said each pulse of said pulse train signal;

counter means responsive to said pulse train signal defined by said shaping means for determining the width of each pulse of said pulse train signal and producing a width signal indicative thereof;

determination means for comparing said width signal with signal representative of a predetermined desired width, said determination means producing a voltage level signal indicative of the relative voltage level of said input information signal in response to said comparison, said voltage level signal monitoring whether the voltage level of said input information is below a predetermined maximum value;

means receiving said digital information signal for determining whether the relative voltage level of said input information exceeds a predetermined minimum value;

whereby an operator may monitor said voltage level signal and said means for determining and adjust the voltage level of the information signal to a proper level for said calculating machine to receive.

2. The machine of claim 1 wherein said information source includes an A.C. coupling amplifier which increases the duration of each pulse frequency modulated by said high frequency signal when an overvoltage is applied thereto.

3. The machine of claim 1 wherein said means for monitoring further comprises indicating means responsive to said level signal for indicating the relative voltage level of said input information signal.

4. The machine of claim 3 wherein said indicating means includes letter information generation means responsive to said voltage level signal for generating a letter corresponding the relative voltage level of said input information signal.

5. The level detection circuit according to claim 3, wherein said indicating means includes a display.

* * * * *